United States Patent
Hayashi

(10) Patent No.: US 8,124,316 B2
(45) Date of Patent: Feb. 28, 2012

(54) PHOTOSENSITIVE SHEETS AND METHOD AND APPARATUS FOR MANUFACTURING THE SAME

(75) Inventor: Kenji Hayashi, Haibara-gun (JP)

(73) Assignee: Fujifilm Corporation, Tokyo (JP)

( * ) Notice: Subject to any disclaimer, the term of this patent is extended or adjusted under 35 U.S.C. 154(b) by 868 days.

(21) Appl. No.: 12/158,244

(22) PCT Filed: Dec. 14, 2006

(86) PCT No.: PCT/JP2006/325440
§ 371 (c)(1),
(2), (4) Date: Jun. 19, 2008

(87) PCT Pub. No.: WO2007/072888
PCT Pub. Date: Jun. 28, 2007

(65) Prior Publication Data
US 2009/0280432 A1 Nov. 12, 2009

(30) Foreign Application Priority Data
Dec. 21, 2005 (JP) .................................. 2005-368515

(51) Int. Cl.
*B41C 1/00* (2006.01)
*G03F 7/09* (2006.01)
(52) U.S. Cl. ...................... 430/271.1; 430/302; 430/531
(58) Field of Classification Search ........................ None
See application file for complete search history.

(56) References Cited

U.S. PATENT DOCUMENTS

| | | | | |
|---|---|---|---|---|
| 3,272,176 A | * | 9/1966 | Saydlowski | ..................... 118/63 |
| 3,597,515 A | * | 8/1971 | Widiger | ......................... 264/556 |
| 4,781,941 A | | 11/1988 | Inukai et al. | |
| 5,030,409 A | * | 7/1991 | Hisanaga et al. | ............. 264/556 |
| 5,223,372 A | | 6/1993 | Yamamoto et al. | |
| 6,110,642 A | * | 8/2000 | Naruse et al. | ............... 430/273.1 |
| 2002/0012877 A1 | | 1/2002 | Denzinger et al. | |
| 2005/0175932 A1 | | 8/2005 | Sampei | |
| 2005/0253276 A1 | | 11/2005 | Yamanaka et al. | |

FOREIGN PATENT DOCUMENTS

| | | |
|---|---|---|
| DE | 33 04 648 A1 | 8/1983 |
| DE | 100 29 157 A1 | 12/2001 |
| EP | 0 883 028 A1 | 12/1998 |

(Continued)

OTHER PUBLICATIONS

English translation of JP, 2003-063162, A (2003) from machine translation from AIPN Japan Patent Office National Center for Industrial Property Information and Training, generated Apr. 20, 2011, 84 pages.*

(Continued)

*Primary Examiner* — Cynthia Hamilton
(74) *Attorney, Agent, or Firm* — Sughrue Mion, PLLC

(57) ABSTRACT

Photosensitive film can be protected in stacking photosensitive sheets and a sheet can be separated one at a time in a state where photosensitive sheets are stacked, ensuring its taking out. An apparatus for manufacturing PS plates, which is adapted to provide photosensitive film on one side of both surfaces of the web, is provided with a coating device for applying coating liquid to form resin film on the other side of the web, a drying device for drying and solidifying the coating liquid applied, and a concave and convex portions forming device for forming concave and convex portions on the surface of the resin film.

5 Claims, 7 Drawing Sheets

FOREIGN PATENT DOCUMENTS

| | | | |
|---|---|---|---|
| EP | 0907107 A2 | 4/1999 |
| EP | 1 167 063 A2 | 1/2002 |
| EP | 1561597 A * | 5/2005 |
| EP | 1 561 597 A2 | 8/2005 |
| FR | 2 521 314 A1 | 8/1983 |
| GB | 2 118 862 A | 11/1983 |
| JP | 50-151136 | 12/1975 |
| JP | 58-137469 A | 8/1983 |
| JP | 59-79846 U | 5/1984 |
| JP | 60-73538 A | 4/1985 |
| JP | 61-67863 A | 4/1986 |
| JP | 6-305271 A | 11/1994 |
| JP | 7-132688 A | 5/1995 |
| JP | 11-52559 A | 2/1999 |
| JP | 2000-275851 A | 10/2000 |
| JP | 2001-117236 A | 4/2001 |
| JP | 2001-151360 A | 6/2001 |
| JP | 2002-46363 A | 2/2002 |
| JP | 2003-54146 A | 2/2003 |
| JP | 2003-63162 A * | 3/2003 |
| JP | 2005-62456 A | 3/2005 |
| JP | 2005-219366 A | 8/2005 |
| JP | 2005-234221 A | 9/2005 |
| WO | 2007010614 A1 | 1/2007 |

OTHER PUBLICATIONS

English translation of JP 59-079846 U (publication of unexamined utility model application, publication dates May 30, 1984, translated for United States Patent and Trademark Office by FLS, Inc. In May 2011, 15 pages.*

European Patent Office, "Supplementary European Search Report," issued in connection with European Patent Application No. 06835053.7, dated Sep. 2, 2010.

* cited by examiner

PHOTOSENSITIVE SHEETS AND METHOD AND APPARATUS FOR MANUFACTURING THE SAME

TECHNICAL FIELD

The present invention relates to photosensitive sheets and a method and apparatus for manufacturing the same, and specifically relates to photosensitive sheets which are easy to separate and take out one at a time from a stack of the photosensitive sheets, and a method and apparatus for manufacturing the same.

BACKGROUND ART

Photosensitive sheets provided with photosensitive film on one side of the support include, for example, planographic printing plates used for offset printing or the like. Planographic printing plates undergo a step for separating and taking out the top sheet one at a time from the stack of planographic printing plates in a state where a plurality of sheets (for example, 100 sheets) of square planographic printing plates are stacked, by using a robot (such as sucker robot), and feeding it to next apparatus (such as exposure machine), system, or the like. During such a process to take out a planographic printing plate one at a time, problems will occur in later processes if a plurality of sheets are taken out at a time; therefore, it is important to ensure that one sheet is separated and taken out at a time from the stack of a plurality of planographic printing plates.

Based on those backgrounds, in the conventional planographic printing plates, papers called slip sheets were alternately placed with the planographic printing plates so as to facilitate the separation from each other and protect them by preventing scratches on photosensitive film due to friction between the planographic printing plates (for example, refer to Japanese Patent Application Laid-Open No. 2001-151360).

However, using slip sheets causes the cost increased, and moreover, prevents the system being compact, requiring a process for alternately placing the slip sheets with the planographic printing plates in stacking the planographic printing plates. Such photosensitive sheets that are separated and taken out one at a time from the stack thereof are not limited to planographic printing plates but also include X ray films, which also have similar problems.

Regarding the roles of slip sheets, protection and separation of photosensitive film, Japanese Patent Application Laid-Open No. 50-151136 discloses providing a soft polymer or paper debris on the support side which is opposite from the photosensitive film, thereby protecting the photosensitive film without using slip sheets when they are stacked. Also, Japanese Patent Application Laid-Open No. 61-67863 discloses providing a coat layer (for example, hydrophobic polymer compounds) having thickness of 100 μm or less on the backside of planographic printing plates having photosensitive layer, thereby preventing scratches being made on photosensitive layer due to friction between the planographic printing plates while being stacked or conveyed.

DISCLOSURE OF THE INVENTION

However, Japanese Patent Application Laid-Open No. 50-151136 and Japanese Patent Application Laid-Open No. 61-67863 have disadvantage that, although slip sheets can protect the photosensitive film, they cannot achieve another role of separating and taking out the photosensitive sheet one at a time in a state where they are stacked.

In view of these circumstances, the present invention has been made for the purpose of providing photosensitive sheets which can eliminate the use of slip sheets, since they are capable of protecting the photosensitive film in stacking the photosensitive sheets and separating one sheet at a time in a state where they are stacked ensuring its taking out, thereby contributing to the reduction of manufacturing cost and compactness of the system, and method and apparatus for manufacturing thereof.

In order to achieve the above mentioned objects, a first aspect of the present invention provides a photosensitive sheet comprising a photosensitive film provided on one side of both surfaces of a support, and a resin film provided on the other side of the support with a number of concave and convex portions formed thereon.

In the first aspect, photosensitive sheets of the present invention provide resin film with a number of concave and convex portions formed on the support surface which is opposite from the side where photosensitive film is provided. This results in forming of air layer between photosensitive film and resin film when a plurality of photosensitive sheets are stacked, thereby reducing the contact resistance, improving the resistance to scratches due to friction between the photosensitive sheets, and further, facilitating the separation of a sheet when separating and taking out one sheet at a time in a state where they are stacked. This can ensure the protection and separation of photosensitive sheets without using slip sheets. In this case, the air layer is formed in the concave portions of the concave and convex portions on the resin film, and the convex portion are in contact with photosensitive film; therefore, the material for resin film is preferably soft resin. Soft resin film may conveniently include, for example, polyethylene, polyvinyl chloride, polyvinylidene chloride, polystyrene, and the like.

Therefore, they can eliminate the use of slip sheets, since they are capable of protecting the photosensitive film in stacking the photosensitive sheets and separating one sheet at a time in a state where they are stacked ensuring its taking out, thereby contributing to the reduction of manufacturing cost and compactness of the system.

A second aspect of the present invention is characterized in that, according to the first aspect, the concave and convex portions on the resin film, as indicated by the centerline average roughness Ra, have 0.15 μm or more and less than the thickness of resin film.

This is because the concave and convex portions on the resin film as indicated by the centerline average roughness Ra can not achieve enough separativity if they do not have 0.15 μm or more. Also, Ra as less than the thickness of resin film means the upper limit of the concave and convex portions. The centerline average roughness Ra is more preferably 0.20 μm or more and less than the thickness of resin film.

A third aspect of the present invention is characterized in that, according to the first or second aspect, photosensitive sheets are planographic printing plates.

It is because that applying the present invention to planographic printing plates is highly effective for reduction of the manufacturing cost and compactness of the system.

In order to achieve the above mentioned objects, a fourth aspect of the present invention provides a method for manufacturing a photosensitive sheet adapted to provide photosensitive film on one side of both surfaces of a support, the method for manufacturing a photosensitive sheet comprising the steps of forming resin film to form resin film on the other side of the support, and forming concave and convex portions on the resin film.

In the fourth aspect of the present invention, resin film are provided on the other side of the support surfaces and concave and convex portions are formed on the resin film, thereby forming-air layer between photosensitive film and resin film when a plurality of photosensitive sheets are stacked. This air layer can reduce the contact resistance, improve the resistance to scratches due to friction between the photosensitive sheets, and further, facilitate the separation of a sheet when separating and taking out one sheet at a time in a state where they are stacked. Thus, protection and separation of photosensitive film without using slip sheets can be ensured. Methods for forming resin film can include laminate method, as well as coating method which will be described below. Methods for forming concave and convex portions on resin film can conveniently include, but not limited to, forming of concave and convex portions by high speed air blow, transferring of concave and convex portions by roller, forming of concave and convex portions by heat-melting, adding of resin particles to coating liquid, and the like, which will be described below. For example, in the case of using curing resin as resin material, which is cured by electronic beam or ultraviolet beam, a variety of above mentioned methods can be combined with a curing step using irradiation of electronic beam or ultraviolet beam.

A fifth aspect of the present invention is characterized in that, according to the fourth aspect, the step of forming resin film includes a step of coating to apply coating liquid so that resin film are formed on the support and a step of drying to dry and solidify the applied coating liquid.

The fifth aspect uses a method for forming resin film in which coating liquid is applied on the support and the coating liquid applied is dried to form resin film, wherein, in the course of coating and drying, concave and convex portions are formed on the resin film. This facilitates each step such as coating and drying resin film and forming concave and convex portions in the resin film to be incorporated into the continuous manufacturing line of photosensitive sheets, in which photosensitive film are generally formed by coating.

A sixth aspect of the present invention is characterized in that, according to the fifth aspect, the step of forming concave and convex portions is a step of applying high speed air flow on the surface of the resin film, which has been coated in the coating step, before or during drying and solidifying of the resin film in the drying step to form concave and convex portions.

The sixth aspect shows one preferable aspect for the step of forming concave and convex portions in which concave and convex portions are formed on the surface of resin film by applying high speed air flow on the surface of the resin film, which has been coated in the coating step, before or during drying and solidifying of the resin film in the drying step.

A seventh aspect of the present invention is characterized in that, according to the sixth aspect, the nozzle opening for blowing high speed air flow has a slit shape.

In the seventh aspect, the nozzle opening for blowing high speed air flow has a slip shape to form linear concave and convex portions on the surface of resin film.

An eighth aspect of the present invention is characterized in that, according to the fifth aspect, the step of forming concave and convex portions is a step of pressing a transfer roller having transferring surface with concave and convex portions onto the surface of the resin film, which has been coated in the coating step, during or after drying and solidifying of the resin film in the drying step to transfer the concave and convex portions.

The eighth aspect shows one preferable aspect for the step of forming concave and convex portions in which concave and convex portions are transferred on the surface of resin film by pressing a transfer surface of the transfer roller on the resin film, which has been coated in the coating step, during or after drying and solidifying of the resin film in the drying step. In this case, a good accuracy is achieved when the transfer is performed with the surface of resin film heated to the glass transition temperature of that resin Tg or higher and the melting temperature of that resin or lower.

A ninth aspect of the present invention is characterized in that, according to the eighth aspect, the transferring surface of transfer roller has a linear shape in such a manner that concave lines and convex lines are alternately formed.

In the ninth aspect, linear concave and convex portions are formed on the surface of the resin film by making the shape of the transferring surface of transfer roller as a linear shape in such a manner that concave lines and convex lines are alternately formed.

A tenth aspect of the present invention is characterized in that, according to the eighth aspect, the transferring surface of transfer roller has a grid shape.

In the tenth aspect, grid concave and convex portions are formed on the surface of the resin film by making the shape of the transferring surface of transfer roller as a grid shape.

An eleventh aspect of the present invention is characterized in that, according to the fifth aspect, the step of forming concave and convex portions is a step of partially heat melting the surface of the resin film dried and solidified, which has been coated in the coating step, after dried and solidified the resin film in the drying step, to form concave and convex portions.

The eleventh aspect shows one preferable aspect for the step of forming concave and convex portions in which concave and convex portions are formed on the surface of resin film by partially heat melting the surface of the resin film dried and solidified, after dried and solidified the resin film in the drying step, which has been coated in the coating step.

A twelfth aspect of the present invention is characterized in that, according to the eleventh aspect, the temperature of heat melting is glass transition temperature of that resin film Tg or higher.

Applying heat of glass transition temperature Tg or higher on the resin film facilitates concave and convex portions to be formed on the resin film.

A thirteenth aspect of the present invention is characterized in that, according to the fifth aspect, the step of forming concave and convex portions is a process of containing resin particles in the coating liquid to be applied in the coating process to form concave and convex portions.

The thirteenth aspect shows one preferable aspect for the process of forming concave and convex portions in which concave and convex portions are formed on the surface of resin film by containing resin particles in the coating liquid to be applied in the coating process.

A fourteenth aspect of the present invention is characterized in that, according to the thirteenth aspect, the resin particles are lubricating agent.

In the fourteenth aspect, by using lubricating agent as resin particles, photosensitive film and resin film are lubricated even if they are rubbed in stacking photosensitive sheets, thereby improving resistance to scratches on the photosensitive film.

A fifteenth aspect of the present invention is characterized in that, according to any one of the fourth to fourteenth aspects, the resin film is provided on the support before the photosensitive film is provided on the support.

In the fifteenth aspect, by providing the resin film on the support before providing the photosensitive film on the support, the photosensitive film can prevent change in quality due to heat or external force (for example, pressing force applied by a roller) in forming concave and convex portions on the resin film.

A sixteenth aspect of the present invention provides photosensitive sheets wherein they are manufactured by the manufacturing method according to any one of the fourth to fifteenth aspects in order to achieve the above mentioned objects.

The photosensitive sheets manufactured by the manufacturing method according to the present invention are capable of protecting photosensitive film when stacking photosensitive sheets and separating one sheet at a time in a state where they are stacked ensuring its taking out, thereby eliminating the use of slip sheets.

A seventeenth aspect is characterized in that, according to the sixteenth aspect, the photosensitive sheets are planographic printing plates. It is because the present invention is more effective when the photosensitive sheets are planographic printing plates.

In order to achieve the above mentioned objects, an eighteenth aspect of the present invention provides an apparatus for manufacturing photosensitive sheets, and the apparatus for manufacturing photosensitive sheets is adapted to provide photosensitive film on one side of both surfaces of the support, comprising a coating device for applying coating liquid to form resin film on the other side of the support, a drying device for drying and solidifying the applied coating liquid, and a concave and convex portions forming device for forming concave and convex portions on the surface of resin film.

An eighteenth aspect is an apparatus configured according to the present invention.

A nineteenth aspect to a twenty first aspect show a preferable aspects of the concave and convex portions forming device for forming concave and convex portions on the surface of the resin film, and can employ air blower device for blowing high speed air flow on the surface of the resin film, a transfer roller for pressing a transferring surface having concave and convex shapes onto the surface of resin film, or heating device for partially heat melting the surface of resin film.

According to the present invention, it is possible to protect the photosensitive film in stacking the photosensitive sheets and separate one sheet at a time in a state where they are stacked, ensuring its taking out, thereby eliminating the use of slip sheets. Therefore, it can contribute to the reduction of manufacturing cost and compactness of the system.

DESCRIPTION OF SYMBOLS

| | Description of Symbols |
|---|---|
| 10 | Manufacturing line for planographic printing plates |
| 12 | Feeding device |
| 14 | Surface processing unit |
| 15 | Resin film shape control unit |
| 15A | Coating device (Resin film) |
| 15B | Drying device |
| 15C | Concave and convex portions forming device |
| 30 | Coating unit (Photosensitive film) |
| 32 | Drying unit |
| 40 | Coating unit (Overcoat layer) |
| 42 | Drying unit |
| 44 | Winding up device |
| A | Resin film |
| B | Photosensitive film |
| W | Web |
| 100 | Processing line |
| 200 | Exposure system |
| 300 | Exposure system |
| 302 | Plate setter |
| 304 | Heating oven |
| 306 | Automatic developer |
| 308 | Control device |

BEST MODE FOR CARRYING OUT THE INVENTION

The preferred embodiment of photosensitive sheet, and method and apparatus for manufacturing thereof will be described below according to the appended drawings. Manufacturing of photosensitive sheets according to the present invention will be described using an example in which planographic printing plates are manufactured as follows.

Figure 1:
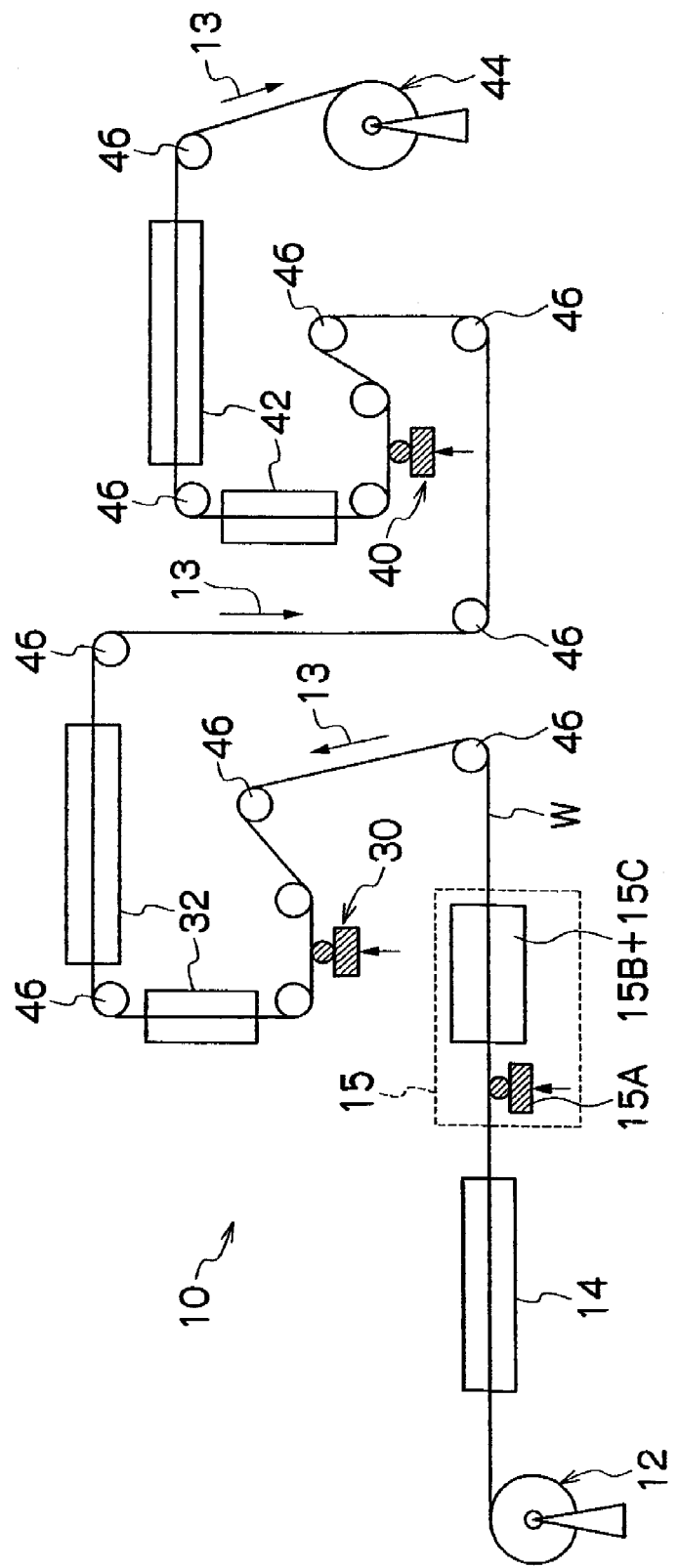
FIG. 1 is a configuration view of one example of manufacturing line of planographic printing plates incorporating the present invention.

FIG. 1 is a configuration view of one example of a manufacturing line 10 of planographic printing plates for manufacturing a strip-shaped raw sheet of planographic printing plates incorporating the present invention. The main part of the present invention is to provide a resin film having a number of concave and convex portions to one side of both surfaces of the strip-shaped support (hereinafter referred to as web W) which is the opposite from the side where photosensitive film are provided, therefore the unit for this process should be referred to as resin film shape control section in the following.

A web W is fed from a feeding device 12 under guidance by the guide rollers 46 to a surface processing section 14. In the surface processing section 14, pre-processings necessary for the web W such as degreasing processing to improve adherence between web W and photosensitive film, roughening processing to roughen the surface of web W (such as grain processing), anodic oxidization processing to form a oxidation coating on the surface for improved abrasion resistance, chemical resistance, and water retention of the web W, silicate processing for improved coating strength, hydrophilicity, and adherence with photosensitive film of the anodic oxidation coating, and the like. The Web W for the planographic printing plates can conveniently includes, for example, aluminum plates, aluminum alloy plates, and papers or plastics with aluminum plates or aluminum alloy plates laminated on their both sides. The thickness of the web W is not particularly limited, but in practice, preferably within the range of 0.01 to 0.5 mm.

The web W is then fed to the resin film shape control unit 15. The resin film shape control section 15 is primarily composed of a coating device 15A for applying coating liquid to form resin film on one side of both surfaces of the web W which is opposite from the side where photosensitive film are provided, drying device 15B for drying and solidifying the applied coating liquid, and concave and convex portions forming device 15C for forming concave and convex portions on the surface of resin film. A coating device 15A is not particularly limited to but includes, for example, extrusion coater, slide bead coater, curtain coater, bar coater, spray coater, dip coater, air knife coater, blade coater, role coater, and the like, and preferably includes, among others, but not particularly limited to, slide bead coater, curtain coater, bar coater, extrusion coater, and the like, which are easy to control the amount of coating. Also, the temperature for drying resin film in the drying device 15B, as indicated by a temperature of web W, is preferably a glass transition temperature of 100 degrees or less of the resin film, and more preferably, a glass transition temperature of 50 degrees or less of the resin film.

Figure 2A:
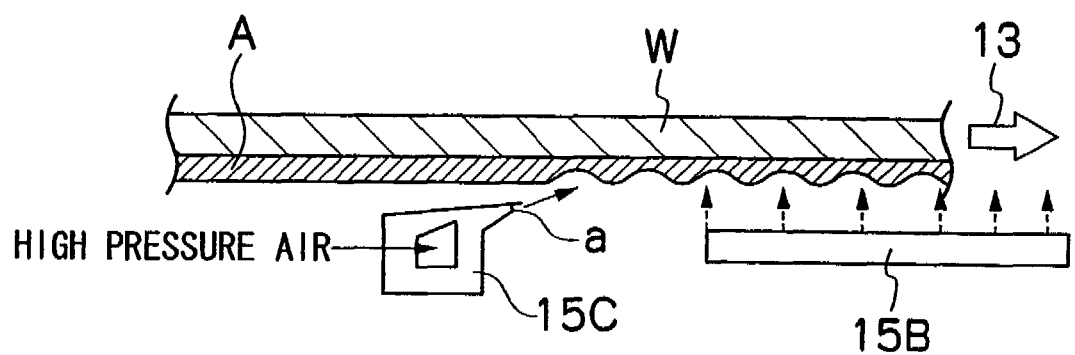
FIGS. 2A and 2B are explanation views of one aspect of forming concave and convex parts on the surface of resin film.
Figure 2B:
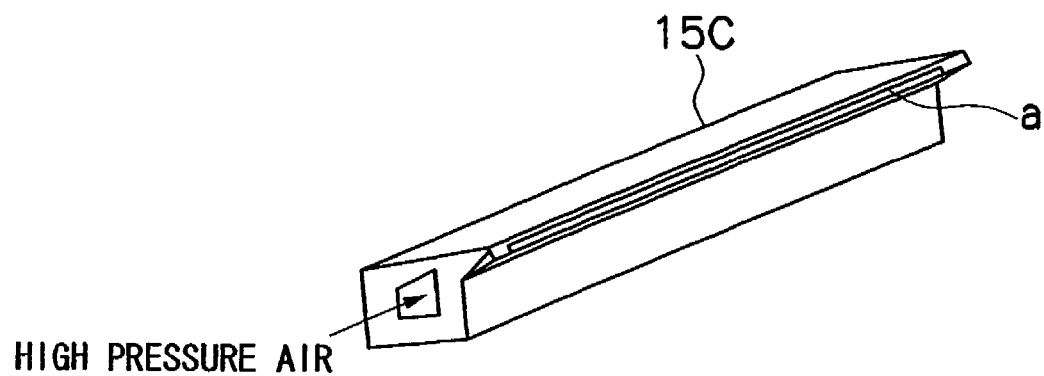

FIGS. 2A and 2B are aspect of using an air blower device as the concave and convex portions forming device 15C in the resin film shape control unit 15. Arrow 13 indicates a feeding direction of the web W. As shown in FIG. 2A, concave and convex portions are formed on the resin film A, which has been coated using the coating device 15A by applying high speed air flow on the surface of the resin film A from the nozzle opening a of the air blower device, before the resin film A is dried and solidified by drying device 15B, that is, while it is still soft. In this case, the velocity of the air flow is preferably within the range of 5 to 40 m/second, and more preferably, 15 to 35 m/second. The direction of air flow is preferably obliquely forward to the feeding direction of the web W. Incidentally, forming of concave and convex portions by applying high speed air flow can be done not only before the drying and solidifying step but also during the drying and solidifying step.

The surface of the resin film A where a number of concave and convex portions are formed is dried and solidified by removing solvent in the resin film using following drying device 15B. The drying device 15B may be any of those capable of drying and solidifying the surface of the resin film A, but can employ hot air dryer which blows air to such an extent not to damage the concave and convex portions formed, infrared heater, halogen heater, and the like. In the case of organic solvent or the like is used, it is preferable that resin film A is dried and solidified while web W is fed within the tunnel casing having a exhaustion device.

As shown in FIG. 2B, the shape of nozzle opening a of the air blower device 15C may be that of slit type parallel to the width direction of the web W. In the case of this nozzle opening a, linear concave and convex portions are formed such that concave lines and convex lines are alternately formed on the surface of a resin film A in the web W feeding direction.

Figure 3A:
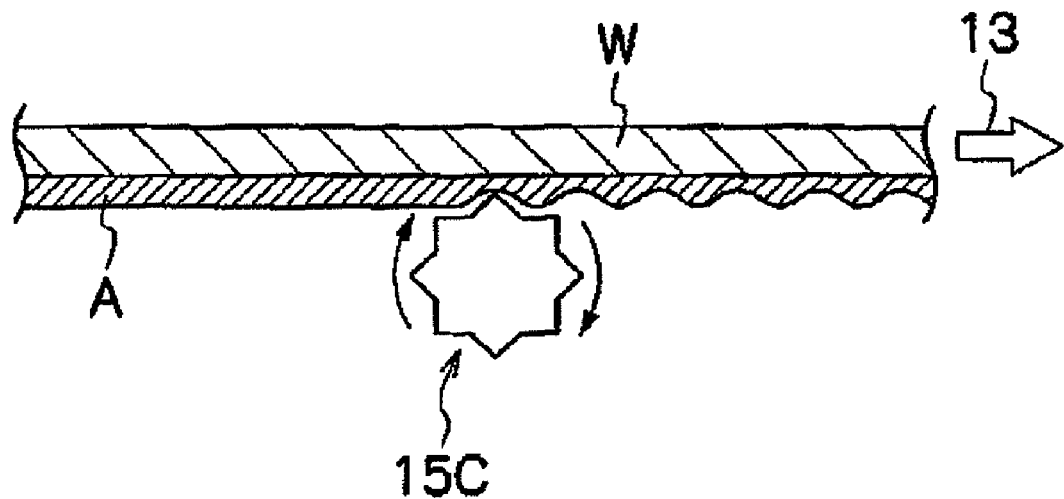
FIGS. 3A and 3B are explanation views of another aspect of forming concave and convex parts on the surface of resin film.
Figure 3B:
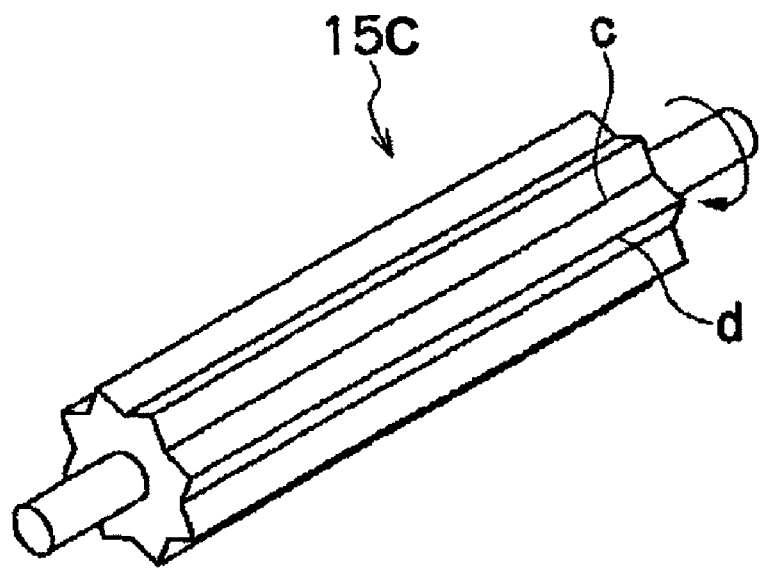

FIGS. 3A and 3B are aspect of using transfer roller as concave and convex portions forming device 15C in the resin film shape control unit 15. In this aspect, concave and convex portions are transferred on the resin film A which has been coated by the coating device 15A, after dried and solidified by drying device 15B, by pressing the transfer roller having concave and convex transferring surface onto the surface of the resin film A, as shown in FIG. 3A. In this case, a good accuracy is achieved when the transfer is performed with the surface of the resin film A heated to the glass transition temperature of that resin Tg or higher and the melting temperature of that resin or lower. The concave and convex portions can also be formed by pressing the transfer roller on the surface of the resin film A during the drying and solidifying step.

The transferring surface of the transfer roller can conveniently employ such a shape that concave linear portions c and convex linear portions d are alternately formed on the circumference of the transfer roller around the axial direction of the transfer roller, as shown in FIG. 3B. This results in forming of linear concave and convex portions on the surface of the resin film A. Although not shown herein, the transferring surface is also preferable to be a grid-shape to form grid-shaped concave and convex portions on the surface of the resin film A.

Figure 4:
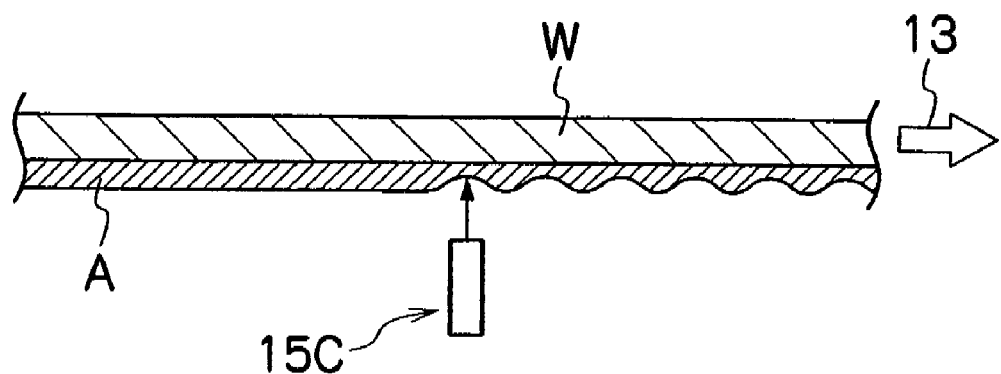
FIG. 4 is an explanation view of still another aspect of forming concave and convex parts on the surface of resin film.

FIG. 4 is an aspect of using a heat melting device as concave and convex portions forming device 15C in the resin film shape control unit 15. The concave and convex portions are formed on the surface of the resin film A by partially heat melting the surface of the resin film A which has been coated by the coating device 15A, after dried and solidified by drying device 15B, as shown in FIG. 4. A laser irradiation device, an infrared lamp, and the like can be used as the heat melting device, and by intermittently irradiating the laser beam or infrared beam onto the surface of the resin film A of the web W which is fed in the direction of arrow 13, the concave and convex portions can be formed on the surface of the resin film A. In the case of using laser irradiation device to form linear concave and convex portions such that concave lines and convex lines are alternately formed on the surface of the resin film A in the feeding direction of web W, laser beam can be scanned in the direction of web W width using polygon mirror or the like.

Although not shown herein, concave and convex portions can also be formed on the surface of the resin film A by containing resin particles in the coating liquid to be supplied to the coating device 15A and forming resin film A with this coating liquid. In this case, using lubricating agent as resin particles results in facilitating the separation of a sheet when separating and taking out one sheet at a time from a stack of planographic printing plates, and also improving resistance to scratches on photosensitive layer, even if friction between the photosensitive film and resin film occurs.

The material of resin film A, which is formed in the resin film shape control unit 15, preferably has the glass transition temperature of 50 degrees or higher, and more preferably, 80 degrees or higher in regard to forming concave and convex portions on the resin film A. Regarding to the type of resin, polystyrene, polyethylene, polyethylene terephthalate (PET), polyvinyl chloride, polyvinylidene chloride, EB (electronic beam) curing resin, UV (ultraviolet beam) curing resin, and the like can be used. Specifically, in order to make photosensitive film resistant to scratches when planographic printing sheets are stacked, soft resin is preferable.

In the case of using EB (electronic beam) curing resin or UV (ultraviolet beam) curing resin for the resin film type, concave and convex portions may be formed on the uncured resin before cure, using the above described concave and convex portions forming device, so that the resin film A on which has formed the concave and convex portions is cured by irradiating electronic beam or ultraviolet beam from electronic beam irradiation device or ultraviolet beam irradiation device. Although the coating method for applying a coating liquid on the web W to form resin film is described as a method for forming resin film in the present embodiment, laminate method to laminate resin film A on the web W, or the like is also available.

The concave and convex portions thus formed on the surface of the resin film A, as indicated by the centerline average roughness Ra, preferably have 0.15 μm or more and less than the thickness of resin film A, and more preferably, 0.20 μm or more and less than the thickness of resin film. By forming the concave and convex portions having this Ra, air layer is formed between photosensitive film and resin film of the planographic printing plates, thereby reducing the contact resistance and improving the resistance to scratches due to friction between photosensitive sheets by the air layer. Also, it facilitates the separation of a sheet when planographic printing plate is separated and taken out one at a time in a state where they are stacked. In this case, resin film A preferably has a thickness within the range of 5 to 15 μm. Also, resin film A formed on the web W is not limited to be a single layer, but a plurality of layers of different types of resin film may also be formed.

Figure 5:
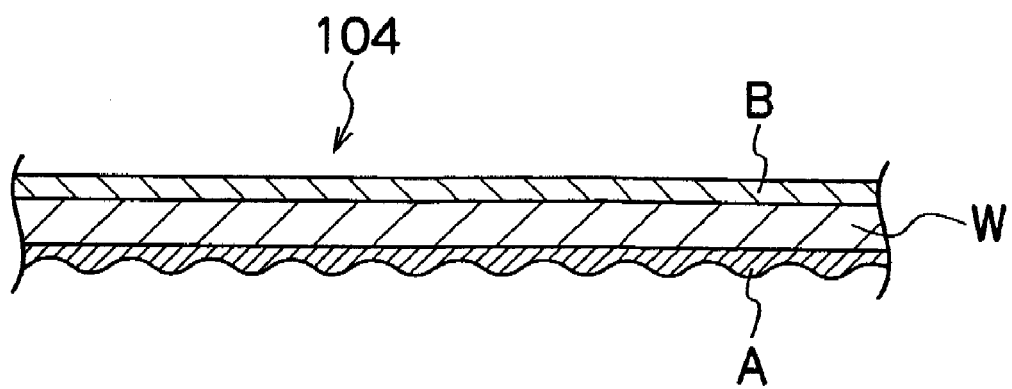
FIG. 5 is an explanation view of layer configuration of photosensitive sheets (planographic printing plates) according to the present invention.

As shown in FIG. 1, the web W in which concave and convex portions are formed on the surface of the resin film A in the resin film shape control unit 15 is then fed to a coating unit 30 where photosensitive film B is applied on the surface of web W which is opposite from the side where resin film A is formed. This results in forming of strip-shaped row sheet for planographic printing plates (photosensitive sheets) composed of photosensitive film B provided on one side of the both surfaces of web W and resin film A provided on the other side of web W with a number of concave and convex portions formed thereon, as shown in FIG. 5. In this case, undercoat film may be formed under the photosensitive film B to improve adherence between web W and photosensitive film B. Incidentally, photosensitive film B is not limited to be a single layer but also a plurality of layers. For the coating method of photosensitive film B, similar method to the above described with the resin film shape control unit 15 can be used. Then, the web W is fed to a drying unit 32, and the photosensitive film B formed on the web W is dried using a known drying method.

Then, in the coating unit 40, coating liquid for forming overcoat layer is applied on the photosensitive film B. The overcoat layer can be easily removed in printing and contains resin selected from organic polymer compounds. For the coating method of the overcoat layer, similar method to the above described with the resin film shape control unit 15 can be used. The web W with the overcoat layer applied is dried in the drying unit 42 and then finally wound up by a winding up device 44. Thus, strip-shaped raw sheet for planographic plates 104 is manufactured.

Figure 6:
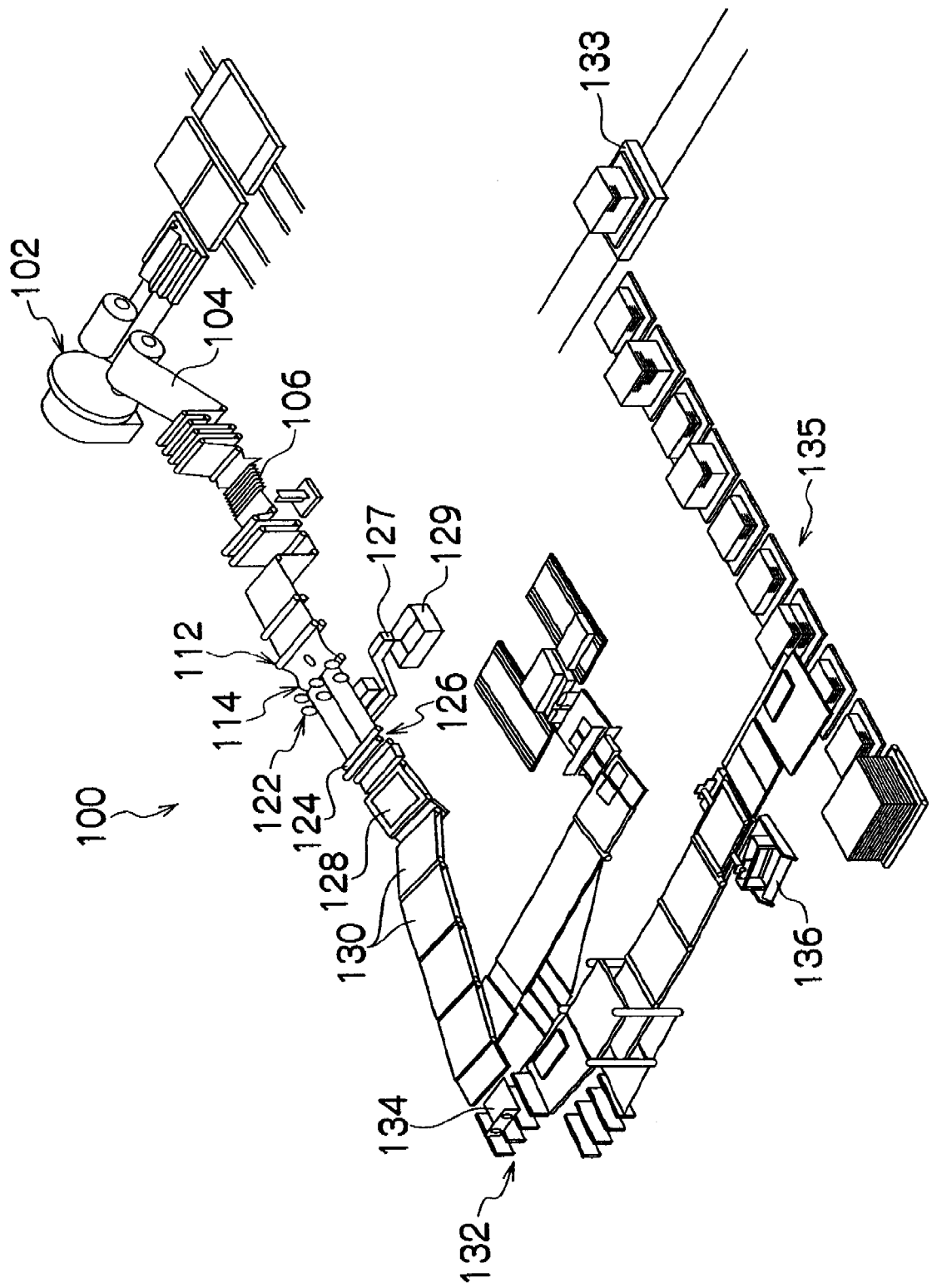
FIG. 6 is a configuration view of processing line for processing a strip-shaped raw sheet for planographic printing plates.

FIG. 6 is a processing process for cutting a strip-shaped raw sheet of planographic printing plates into sheets having predetermined vertical and horizontal sizes (hereinafter referred to as PS sheet) and loading them.

As shown in FIG. 6, on the upper side of this processing line 100 (upper side of FIG. 6), feeding device 102 for sequentially feeding out strip-shaped raw sheet 104 of planographic printing plates, manufactured in FIG. 1, is disposed. The strip-shaped raw sheet 104 of planographic printing plates is fed out from the feeding device 102 toward a notcher 112 after curl-corrected by leveler 106. In the previous processing line, a strip-shaped slip sheet (not shown) is supplied from a slip sheet supplying line not shown and superposed by a strip-shaped raw sheet 104.

The notcher 112 provides a notch on the web 104 so that upper blade and lower blade (not shown) of a cutting roller 122 which compose a cutting unit 114 can move in the width direction of strip-shaped raw sheet 104 at the notching position. This enables the strip-shaped raw sheet 104 to continuously cut together, changing the trimming width of the strip-shaped raw sheet 104.

The strip-shaped raw sheet 104 thus cut to a predetermined trimming width is fed to a measuring device 124 to detect feeding length, and cut by an inter-running cutter 126 at a specified timing. This forms a PS sheet 128 having a predetermined size.

Also, a conveyer 127 for conveying debris of strip-shaped raw sheet 104 and the like and recovering box 129 for recovering the debris conveyed by the conveyer 127 may be provided in the processing line 100, as shown in FIG. 6. Furthermore, a winding up device (not shown) may also be provided to sequentially wind up the debris into a roll shape.

Then, PS sheet 128 is conveyed to collecting unit 132 by a conveyer 130 and stacked by predetermined sheets to form a bundle 134. In forming such bundle 134, the present invention provides resin film A on the side of PS sheet 128, which is opposite from the side where photosensitive film B is provided, to form concave and convex portions on the resin film A, thereby preventing scratches on the photosensitive film B without interleaving slip sheets between PS sheets 128 as in the previous one.

The bundle 134 is inverted by a bundle inverting device 136 then stacked on a pallet 133 through a conveying unit 135.

Figure 7:
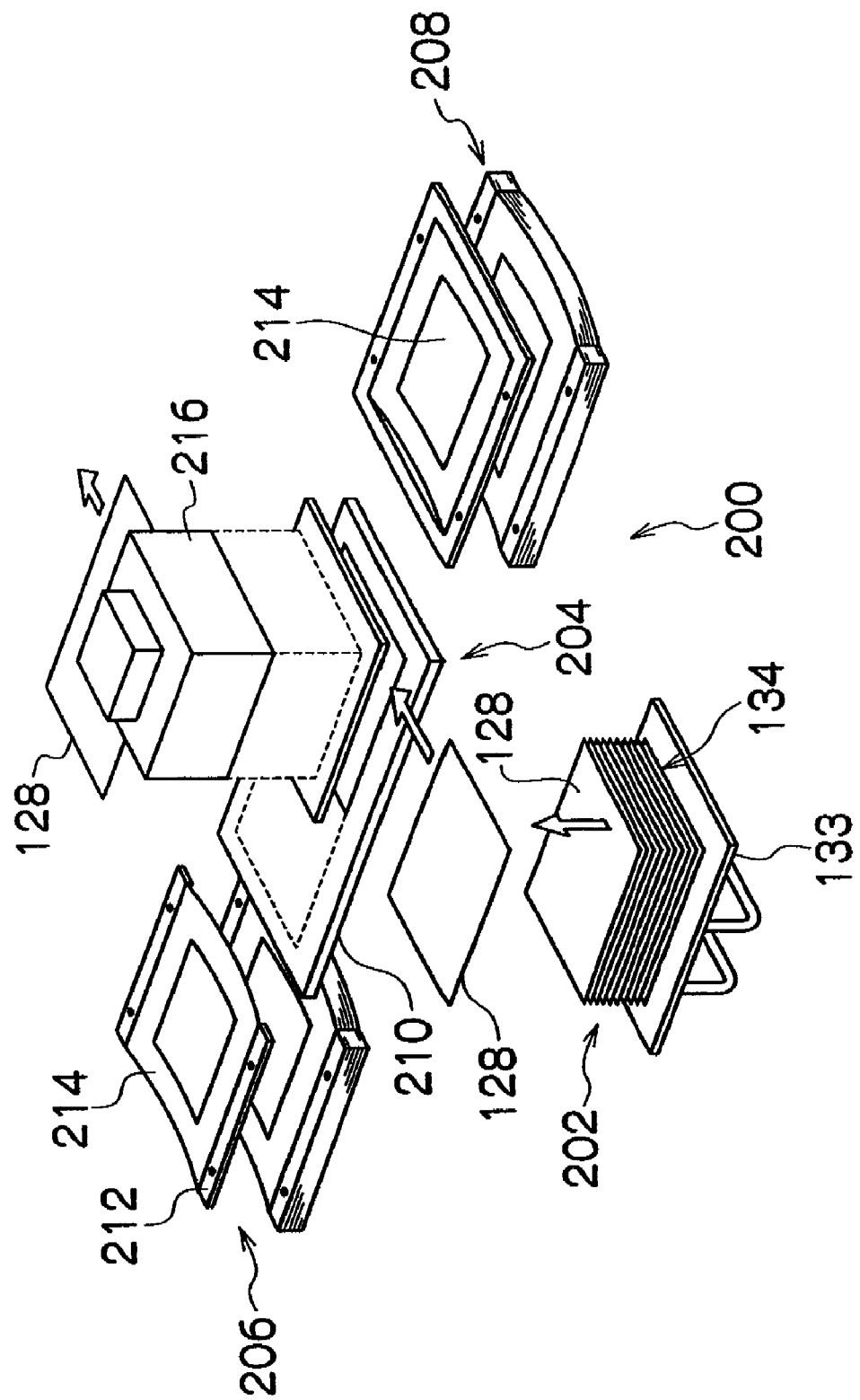
FIG. 7 is an explanation view of exposure system using negative (lith) film for an automatic developer in which a stacked PS plate is taken out one at a time from a bundle thereof to apply it developing process.

FIG. 7 is an explanation view of exposure system 200 using negative (lith) film and shows a part of an automatic developer in which a PS plate 128 is taken out one at a time from a bundle 134 thereof stacked on the pallet 133 to apply it developing process. The exposure system 200 includes a plate feeding unit 202, an exposure unit 204, a negative feeding unit 206, and a negative feeding out unit 208. In plate feeding unit 202, the PS plate 128 is sequentially taken out one from the top PS plate 128 at a time from the bundle 134 of the PS plates 128 stacked on the pallet 133, using a feeding device such as sucker, and fed to a plate base 210 in the exposure unit 204. On the plate base 210, a plurality of sucking bores are formed, therefore the PS plate 128 is fixed on the plate base 210 at the predetermined exposure position by be ing sucked using a sucker which is not shown.

Meanwhile, a negative film 214 attached to a negative film sheet 212 is fed from the negative feeding unit 206 to above the plate base 210, using a negative feeding device which is not shown. A light source 216 which is placed further above emits a light so that the PS plate 128 is exposed. A lamp hood which is movable upward and downward is provided around the light source 216 to move downward during exposure so that the lamp hood completely shield the area other than necessary for exposure from a light.

After the exposure, the negative film 214 is fed to a negative feeding out unit 208 and the PS plate 128 is fed to a development processing unit.

Figure 8:
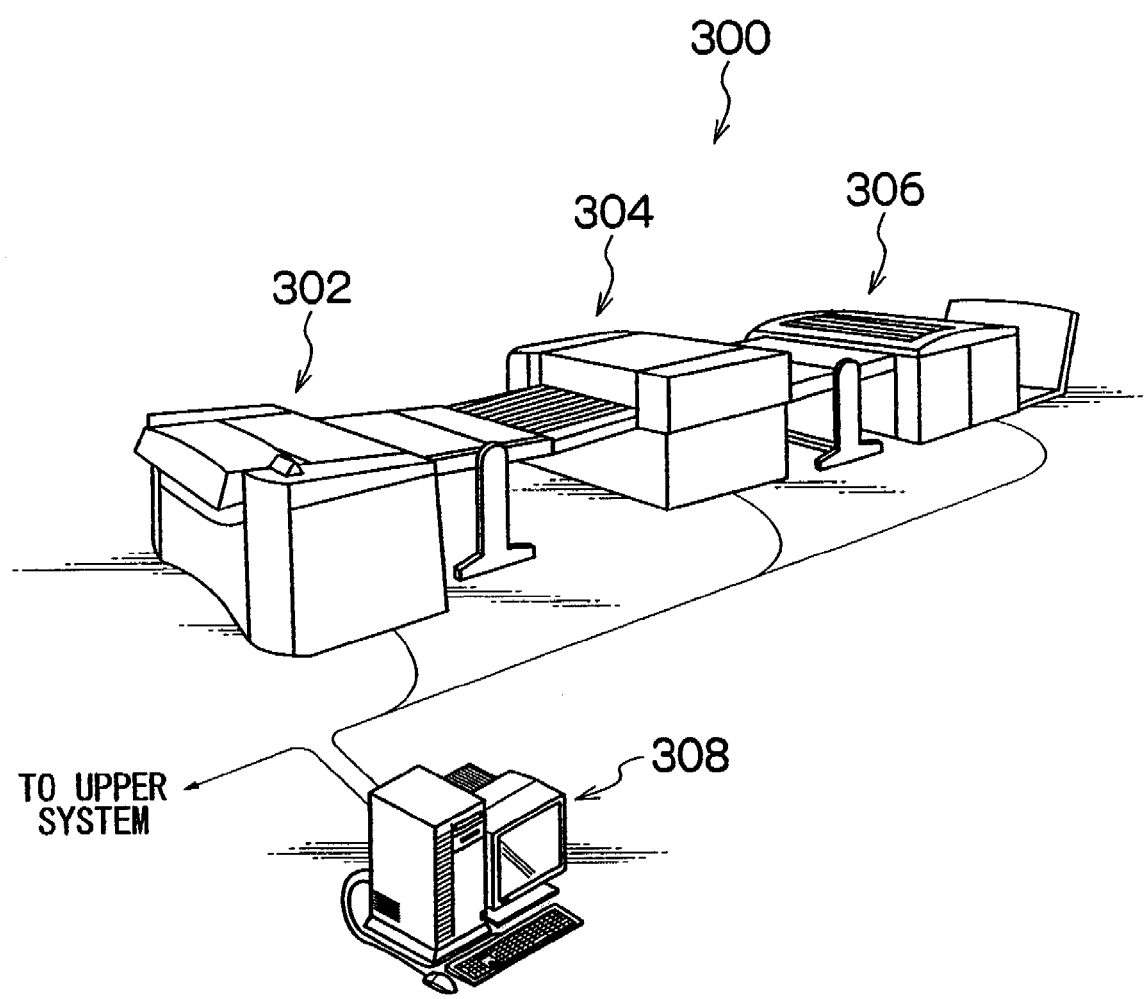
FIG. 8 is an explanation view of CTP exposure system without using negative (lith) film for an automatic developer in which a stacked PS plate is taken out one at a time from a bundle thereof to apply it developing process.

FIG. 8 is an explanation view of CTP exposure system without using negative (lith) film and shows a part of an automatic developer in which a PS plate 128 is taken out one at a time from a stacked bundle 134 thereof to apply it developing process.

As shown in FIG. 8, the CTP exposure system 300 includes a plate setter 302 as an exposure processing unit for exposure processing by laser beam irradiation, and if necessary, a heating oven 304 as a heating unit and an automatic developer 306 as a development unit for development processing. Each of them is connected to computer as a control device 308 and the computer system is configured to link to an upper system.

The plate setter 302 is configured to include, for example, an exposure unit for exposing the PS sheet 128 by laser beam irradiation, a plate feeding in and out mechanism for taking out one PS sheet 128 at a time from the stacked bundle 134 thereof and automatically feeding it into and out of the exposure unit, a color sensor mechanism, and a control unit (control device) for their controlling. The exposure unit may use an outer drum type in, which the PS plate 128 automatically fed out from the plate feeding in and out mechanism is wound around the circumstance of an exposure drum and exposed by irradiating laser beam from laser beam source onto the surface of the PS plate 128 which is wound around while rotating the drum so as to expose an image, as well as an inner drum type in which the PS plate 128 is suckingly mounted on the inner circumference of the drum and exposed by rotating a light source disposed at the center of the drum, and further a flat bed type in which the PS plate 128 is fixed on a flat bed and exposed by moving the laser beam source both in vertically and horizontally.

The laser beam source used for exposure is capable of scanning while moving in the axial direction of the drum by using a guide rail and performs laser irradiation according to the image information processed with a computer which composes the control device 308. For the scanning with laser beam, for example, the rotating direction of drum may be main scanning direction and the axial direction of the drum may be sub scanning direction. The laser beam source can be used unlimitedly as long as the laser irradiation is possible, and a high power semiconductor laser oscillating in infrared range of 700 to 1200 nm or YAG laser of 1064 nm is known as preferable, but a high power semiconductor laser of 830 nm is more preferable.

The PS plate 128 after the exposing processing is automatically fed out from the exposure drum to next process by the plate carrying out mechanism. According to the type of the PS plate 128, a heating oven 40 may be introduced between the plate setter 10 and the automatic developer 306.

In the exposure system of FIGS. 7 and 8, when taking out one plate from the top at a time from the bundle 134 of the PS sheets 128, the present invention provides resin film A having a number of concave and convex portions on one side of PS plate 128 opposite from the side where photo film B are provided, forming air layer between the PS plates, thereby facilitating the separation of the PS plate. Therefore, taking out a plurality of PS sheets 128 can be prevented, avoiding a trouble in later processes.

Examples

Examples of the present invention will be described below. In the examples, as shown in FIGS. 7 and 8, trials for taking out one PS plate 128 from the top at a time from the bundle 134 of the PS plates 128 by using a sucker device is conducted 50 times to test the number of success in which only one plate can be successfully taken out and the pass rate (the number of success/the number of taking out).

Table 1 shows the results.

TABLE 1

| Sample | | Concave and convex forming device | Ra of the surface of resin film | Number of success and pass rate | Evaluation |
|---|---|---|---|---|---|
| Comparative Example 1 | without resin film with slip sheet | — | — | 100% 50/50 | good |
| Comparative Example 2 | without resin film without slip sheet | — | 0.09 µm | 95% 45/50 | disqualified |
| Example 1 | with resin film without slip sheet | Air blower device | 0.15 µm | 96% 48/50 | fair |
| Example 2 | with resin film without slip sheet | Air blower device | 0.20 µm | 100% 50/50 | good |
| Example 3 | with resin film without slip sheet | Air blower device | 0.45 µm | 100% 50/50 | good |
| Example 4 | with resin film without slip sheet | Air blower device | 1.40 µm | 100% 50/50 | good |
| Example 5 | with resin film without slip sheet | Transfer roller | 2.30 µm | 100% 50/50 | good |

Comparative example 1 is a conventional sample in which resin film A is not formed on the backside of the web W of the PS sheet 128 where photo film B is not formed, and slip sheets are interleaved between PS sheets 128.
Comparative example 2 is a sample in which resin film A is not formed on the backside of the web W of the PS sheet 128 and slip sheets are not interleaved between PS sheets 128. The centerline average roughness Ra of the comparative example 2 is a roughness of the backside surface of the web W.
Example 1 is a sample in which resin film A having thickness of 10 µm is formed on the backside of the web W of the PS sheet 128 while concave and convex portions having centerline average roughness Ra of 0.15 µm are formed on the surface of the resin film A by using air blower device 15C.
Example 2 is a sample manufactured in a similar manner as Example 1 except that concave and convex portions having centerline average roughness Ra of 0.20 µm are formed on the surface of the resin film A.
Example 3 is a sample manufactured in a similar manner as Example 1 except that concave and convex portions having centerline average roughness Ra of 0.45 µm are formed on the surface of the resin film A.
Example 4 is a sample manufactured in a similar manner as Example 1 except that concave and convex portions having centerline average roughness Ra of 1.40 µm are formed on the surface of the resin film A.
Example 5 is a sample in which resin film A having thickness of 10 µm is formed on the backside of the support of the PS sheet 128 while concave and convex portions having centerline average roughness Ra of 2.30 µm are formed on the surface of the resin film A by using transfer roller 15C.

For evaluation standard of the table 1, each fair and good is regarded as pass, while troubles frequently occurred in the case of disqualified.

As seen from the result of Table 1, in Comparative example 1 using conventional slip sheet, the number of success out of 50 times of trials was 50 and the pass rate was 100%. However, in Comparative example 2 without using slip sheet, the number of success was 45 and the pass rate was 90%, evaluated as disqualified.

On the other hand, in Example 1 with resin film A having Ra of 0.15 µm, the number of success was 48 and the pass rate was 96%, showing a higher pass rate compared with Comparative example 2, although lower than Comparative Example 1 with using slip sheet. In all Examples 2 to 5 with resin film A having 0.20 µm or more, the number of success was 50 and the pass rate was 100%.

The invention claimed is:

1. A method for manufacturing a photosensitive sheet comprising the steps of:
    forming a photosensitive film on one side of a support, said support having two sides;
    forming resin film to form resin film on the other side of the support; and
    forming concave and convex portions on the resin film, wherein
    the step of forming resin film includes: a coating step to apply coating liquid so that resin film are formed on the support; and a drying step to dry and solidify the coating liquid applied, and
    the step of forming concave and convex portions is a step of applying high speed air flow on the surface of the resin film, which has been coated in the coating step, before or during drying and solidifying of the resin film in the drying step to form concave and convex portions.

2. The method for manufacturing a photosensitive sheet according to claim 1, wherein
    a nozzle opening for blowing the high speed air flow has a slit shape.

3. The method for manufacturing a photosensitive sheet according to claim 1, wherein
    the resin film is formed on the support before the photosensitive film is formed on the support.

4. A photosensitive sheet, wherein
    the photosensitive sheet is manufactured by the manufacturing method according to claim 1.

5. The photosensitive sheet according to claim 4, wherein the photosensitive sheet is a planographic plate.

* * * * *